United States Patent [19]
Rajith et al.

[11] Patent Number: 6,038,177
[45] Date of Patent: Mar. 14, 2000

[54] DATA PIPELINE INTERRUPT SCHEME FOR PREVENTING DATA DISTURBANCES

[75] Inventors: M. Kumar Rajith, Kannur Kerala; Kallol Mazumder, West Bengal, both of India; Scott E. Smith, Sugar Land; Duy-Loan T. Le, Missouri City, both of Tex.

[73] Assignee: Texas Instruments Incorporated, Dallas, Tex.

[21] Appl. No.: 09/253,848

[22] Filed: Feb. 22, 1999

Related U.S. Application Data

[60] Provisional application No. 60/075,639, Feb. 23, 1998.

[51] Int. Cl.[7] .............................. G11C 16/04; G11C 8/00
[52] U.S. Cl. ................................ 365/189.05; 365/230.06; 365/230.08; 365/233
[58] Field of Search ........................ 365/189.05, 230.06, 365/230.08, 233

[56] References Cited

U.S. PATENT DOCUMENTS

| | | |
|---|---|---|
| 5,511,025 | 4/1996 | Smith et al. ........................ 365/189.05 |
| 5,835,448 | 11/1998 | Ohtani et al. ........................... 365/233 |
| 5,887,272 | 3/1999 | Sartore et al. ..................... 365/230.08 |

*Primary Examiner*—Trong Phan
*Attorney, Agent, or Firm*—Robby T. Holland; Carlton H. Hoel; Richard L. Donaldson

[57] ABSTRACT

A read mask circuit (300) is disclosed. A mask command is shifted through a series of mask latches (308 and 310) to generate the output-enable input (OE_) of an output driver (306). In synchronism with the mask command, data bits are shifted through a series of data latches (312 and 314) to the data input (DIN) of the output driver (306). To prevent a race condition between the mask command and the data bit that is to be masked (B3), the mask command, when latched in the second-to-last mask latch (308), is used to interrupt the last data latch (314). This prevents the to-be-masked data bit (B3) from being latched in the last data latch (314) and generating an undesirable output data transition by the output driver (306).

20 Claims, 4 Drawing Sheets

DATA PIPELINE INTERRUPT SCHEME FOR PREVENTING DATA DISTURBANCES

This application claims priority under 35 USC §119(e)(1) of provisional application No. 60/075,639 filed Feb. 23, 1998.

TECHNICAL FIELD

The present invention relates generally to semiconductor memory devices, and more particularly to read mask circuits for pipelined random access memory devices.

BACKGROUND OF THE INVENTION

Semiconductor memory devices typically access stored data in multiple bit quantities. For example, in response to an applied address, output data could be provided in one or more groups of eight-bit bytes (often referred to as words). By accessing data in this manner, rapid amounts of data can be read or written in a single memory cycle. To further increase the rate at which data can be accessed, many semiconductor memories have "pipelined" architectures. In response to an applied control signal, typically a clock, sequences of bits are rapidly shifted out of the device through a series of stages. Commonly, pipelined architectures are used in synchronous random access memories (RAM), in which data bits are shifted in response to an externally applied system clock. Synchronous RAMs can come in both dynamic and static forms.

While synchronous devices can provide a faster overall data throughput, such devices will have a given latency between access operations and command inputs. For example, while an address may be applied for a read operation on a first clock cycle, the resulting output data may not be available for two or three clock cycles.

While most memory device applications use all the bits provided by a memory device in a given read or write operation, it can be desirable to read or write to only selected bits within a number of accessed bits. For example, while a memory device may provide 16-bits in parallel in a given read operation, it may be desirable to read only the upper or lower byte of data. Furthermore, when reading and writing graphics data, it may be desirable to access only certain predetermined bits within a byte. For such applications, the use of read and write "masks" are employed.

In the case of a read mask, when a number of bits are read from the memory device, selected outputs will provide data, while masked outputs, will not provide data, but instead will be placed in a predetermined state. The predetermined state could be a "tri-state" (a high impedance state) or a given logic level (high or low). In the case of a write mask, when a number of bits are applied to data inputs, selected inputs will allow their respective data to be written into the memory, while masked inputs will not allow their respective data to be written into the memory device.

For pipelined architectures, masked read and write operations must be properly timed with the data being pipelined into, or out of, the memory device. As in the case of an applied address, the application of a mask command may have some latency, particularly in the case of a read mask operation. A problem in synchronous RAMs having mask command latency may arise due to a "race" condition between the mask command path, and the data read path. The mask command propagates along the mask command path to arrive at an output driver, and disable the output driver. At the same time, a data bit (that is to be masked) is propagating along the data read path to the same output driver. In the event the mask command arrives too late, the output driver may be activated for a short time in response to the data bit, rather than be disabled completely. This can produce erroneous output disturbance during that time.

An example of an undesirable race condition is illustrated in FIGS. 1 and 2. FIG. 1 is a block diagram illustrating a portion of a single data bit output path, and a masked read command path. FIG. 2 is a timing diagram illustrating the operation of the block diagram of FIG. 1 that gives rise to an erroneous output data "bump."

Referring now to FIG. 1, a read mask circuit is designated by the general reference character 100. The read data mask circuit is shown to include a mask command path 102 having a first mask latch 104, that is controlled by a clock signal (CLK), arranged in series with a second mask latch 106, also controlled by the clock signal. The output of the second mask latch 106, shown as MASK(n), is provided as an "output enable" input to an output driver 108. In the event the $OE_{13}$ input is low, the output driver 108 will provide an output signal according to a data input signal, received at a DIN input. In the event the $OE_{13}$ signal is high, the output driver 108 will be disabled, and provide a tri-state output. The read mask circuit 100 further includes a portion of a data bit pipeline 110, having a first data latch 112 in series with a second data latch 114. The first and second data latches (112 and 114) are both controlled by the clock signal. It is additionally understood that while FIG. 1 shows MASK(n) directly connected to the $OE_{13}$ input of the output driver, in most designs the $OE_{13}$ is generated by a plurality of signals that are logical-ORd together with MASK(n) being one of the signals.

The operation of the read mask circuit 100 is best understood with reference to FIG. 1 in conjunction with FIG. 2. FIG. 2 includes a number of waveforms illustrating various signals shown in FIG. 1. The CLK signal is the internal clock signal. The MASK signal illustrates the input to the first mask latch 104. A high MASK signal indicates a mask command propagating through the mask command path 102. The MASK signal in FIG. 2 has a latency of two. That is, once a high MASK signal appears at the input of the first mask latch 104, the output bit appearing at the output driver 108 two clock cycles later, will be masked. The output of the first mask latch 104 is shown as MASK(n-1), the output of the second mask latch 106, is shown as MASK(n). (MASK(n) is also the $OE_{13}$ input to the output driver 108).

The data at various points in the data pipeline are also illustrated in FIG. 2. The input to the first data latch 112 is shown as DATA(n-2). The output of the first data latch 112 is shown as DATA(n-1). The output of the second data latch 114 is shown as DATA(n). DATA(n) is also the DIN input to the output driver 108. Finally, the output of the output driver 108 is shown as DQ.

The waveforms of FIG. 2 illustrate the pipelined read of six data bits, shown as B0–B5. The fourth bit, B3 is to be masked. Further, it is assumed that the logic of bit B3 is different from that of bit B2. Various time periods are illustrated in FIG. 2, beginning with time t0.

At time t0, the CLK signal is low. No MASK command has been applied, and so the MASK, MASK(n-1) and MASK(n) waveforms are low. Three data bits are in the data pipeline 110 at this time. Bit B0 is stored in the second data latch 114, resulting in the DATA(n) signal being the value of B0. Bit B1 is stored in the first data latch 112, resulting in the DATA(n-1) signal being the value of B1. Finally, bit B2 is present at the input of the first data latch 112, resulting in the DATA(n-2) signal being the value of B2. Because the MASK(n) signal is low, the $OE_{13}$ input is low, and the output driver 108 is enabled, providing a DQ output equivalent to the DIN input (bit B0).

At time t1, the CLK signal transitions to a high level. During the same clock style, the MASK waveform goes high, indicating the reading in of a mask-command at the input of the chip, and hence at the input to the first data latch 104. For the purposes of this description it is assumed that there is some propagation delay within the mask command path 102, more so than in the data bit pipeline 110. Accordingly, the MASK signal transitions high a certain delay after time t1. Because the high MASK transition has not yet propagated through the mask command path 102, the MASK(n) and MASK(n−1) waveforms are low.

In response to the high CLK signal at time t1, data propagates through the data pipeline 110. As a result, the DATA(n), DATA(n−1) and DATA(n−2) waveforms illustrate the shifted data, storing the B1, B2 and a B3 bit, respectively. Because the MASK(n) ($OE_{13}$ input) remains low, the DQ output changes to the B1 value.

At time t2, the CLK signal transitions to a high level once again. No new mask command has been entered, and so the MASK waveform returns low shortly after time t2. At the same time, the MASK signal goes low, the second mask latch 106 shifts the mask command one more step along the mask command path 102. Consequently, the MASK(n−1) waveform goes high. The MASK(n) signal remains low.

Also at time t2, the data bits in the pipeline propagate to the next stage in the pipeline. A new data bit, B4 is present at the input to the first data latch 112. Bit B3 (the bit to be masked) is latched in the first data latch 112, resulting the DATA(n−1) signal being equal to B3. The B2 data bit is latched in the second data latch 114. Because the $OE_{13}$ input remains low, the DQ waveform is equal to the B2 bit value.

At time t3, the CLK signal begins a third cycle, and transitions high a third time. Because the mask command path 102 is delayed with respect to the data bit pipeline 110, the MASK(n−1) and MASK(n) waveforms remain high and low, respectively, at time t2. In contrast, the data bit pipeline 110 continues to shift data bits in synchronism with the CLK signal. In other words, in the race condition between the data pipeline 110 and the mask command path 102, the data pipeline 110 wins. As a result, at time t3, the second data latch 114 latches the bit B3 prior to the $OE_{13}$ input going high, and so the DQ output transitions to the B3 value at time t3. This creates an undesirable erroneous data "bump" at the data output.

At time t4, the MASK(n−1) signal goes low, and the MASK(n) signal transitions high. The output driver 108 is disabled, and the DQ output is placed in a tri-state condition. The data bump is terminated, but only after it has caused an erroneous transition in the DQ output.

It would be desirable to provide a read mask circuit that does not suffer from the adverse effects of the race condition illustrated above.

SUMMARY OF THE INVENTION

According to the preferred embodiment, a read mask circuit includes a mask command path, a data path, and an output driver. The mask command path includes a series of clocked stages, including a last, and second-to-last stage. The mask command propagates through the stages to the output driver. The data path includes a series of similarly clocked stages, including a final stage. The data propagates through these stages to the output driver. To eliminate the adverse effects of a race condition between the mask command path and the data path, the final stage of the data path is interrupted by the values latched in the second to last stage of the mask command path. This prevents the data bit that is to be masked from being latched in the final stage of the data path.

According to one aspect of the present invention, the stages within the mask command path and data path are clocked by a clock that is synchronous with a system clock.

DETAILED DESCRIPTION OF THE EMBODIMENTS

The preferred embodiment is a read mask circuit for a synchronous random access memory (RAM) device. The memory device operates in synchronism with an externally applied system clock. Accordingly, an internal clock, synchronous with the external system clock is used to control the timing of the read mask circuit. The preferred embodiment may be implemented in a synchronous dynamic RAM (SDRAM) as just one example.

Figure 3:
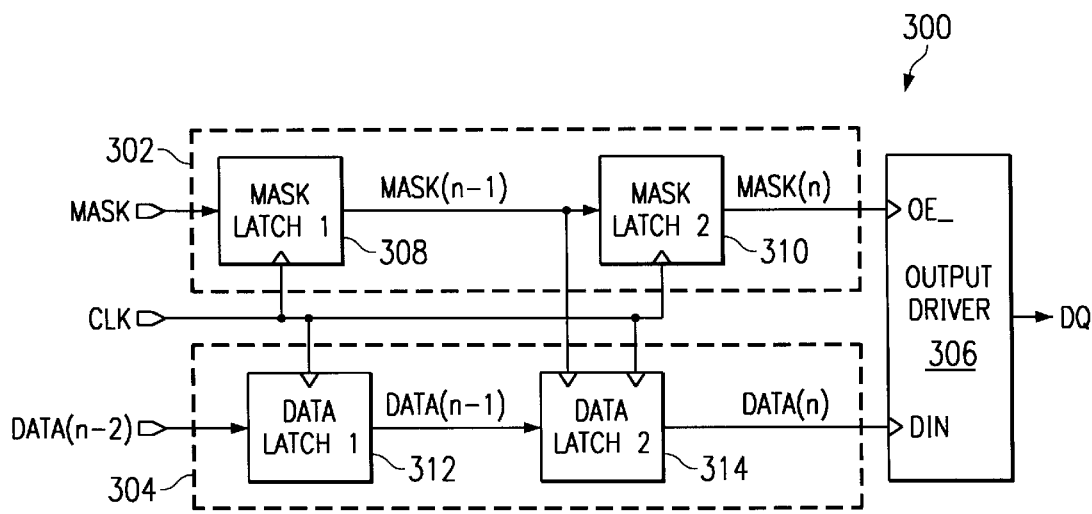
FIG. 3 is block diagram of a preferred embodiment.

Referring now to FIG. 3, the read mask circuit of the preferred embodiment is designated by the general reference character 300, and is shown to include a mask command path 302, a data bit path 304, and an output driver 306. The mask command path 302 includes a first mask latch 308 and a second mask latch 310. Each of the mask latches (308 and 310) latches an input value in response to a high transition in an internal clock signal. The second mask latch 310 can be conceptualized as the last stage in the mask command path 302. The first mask latch 308 can be conceptualized as the second-to-last stage in the mask command path 302. The internal clock is shown as CLK. While the particular embodiment of FIG. 3 sets forth two latches in the mask command path, the mask command path 302 could include a larger number of such latches.

The output driver 306 includes an output enable input $OE_{13}$ and a data input DIN. In response to these two inputs, the output driver provides a data output signal DQ. In the event the $OE_{13}$ input is high, the output driver 306 is disabled, and the DQ output is placed in a tri-state (i.e., high impedance) condition. In the event the $OE_{13}$ signal is low, the output driver 306 is enabled, and the DQ output will track the DIN input value. The output driver 306 "masks" read output data, by placing the DQ output in the tri-state condition in a given cycle of the system clock.

The data bit path 304 includes a first data latch 312 in series with a second data latch 314. The first data latch 312 is responsive to the CLK signal, and latches data at an input DATA(n−2) in response to low-to-high transitions in the CLK signal. The second data latch 314 is controlled by the CLK signal as well, but in addition, is further controlled by the MASK(n−1) output from the first mask latch 308. The second data latch 314 operates in a similar fashion to the first data latch 312, latching data at the output of the first data latch 312 when the clock signal is high, with one exception. An active MASK(n–1) signal (in the embodiment of FIG. 3, high logic level) will interrupt the operation of the second data latch 314, preventing it from latching the data that is to be masked, and thereby preventing the formation of a erroneous data "bump." Thus, the second-to-last stage of the mask command path 302 is used to prevent the propagation of "to-be-masked" data to the last stage of the data path 314.

Figure 4:
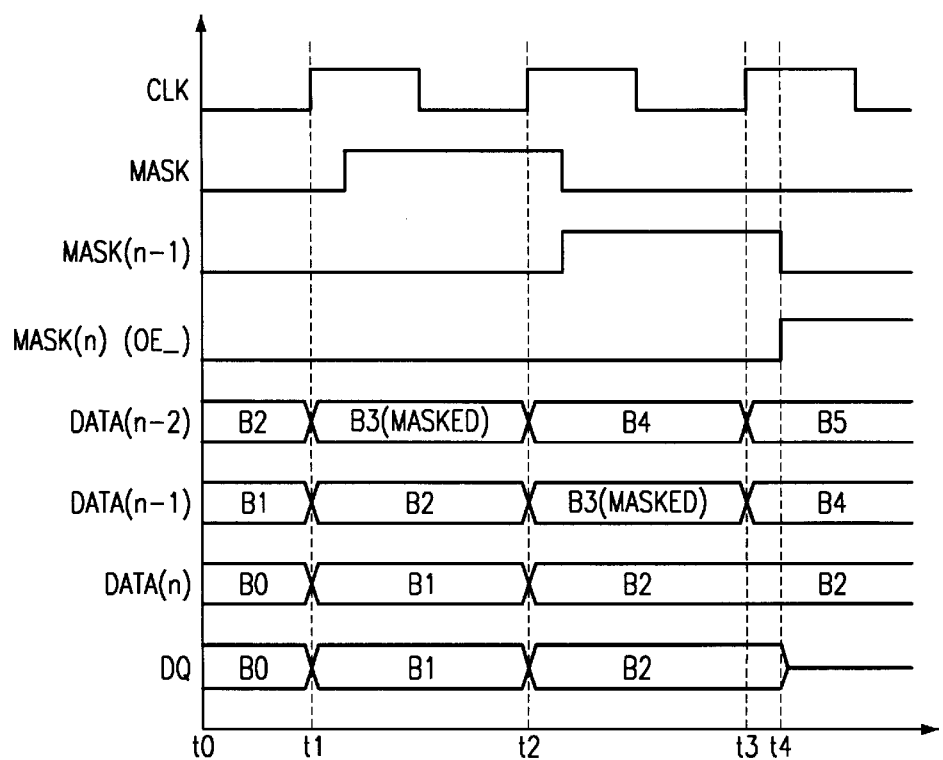
FIG. 4 is a timing diagram illustrating the operation of the embodiment set forth in FIG. 3.

Referring now to FIG. 4, the operation of the embodiment set forth in FIG. 3 is described in series of waveforms. The internal clock signal (synchronous with a system clock) is illustrated. The input to the first mask latch 308 is shown as MASK. The output of the first mask latch 308 is shown as MASK(n–1). The output of the second mask latch 310, (and also the $OE_{13}$ input to the output driver 306) is shown as MASK(n).

The input to the first data latch 312 is shown as DATA (n–2). The output of the first data latch 312 is shown as DATA (n–1). The output of the second data latch 314 (and also the DIN input to the output driver 306) is shown as DATA(n). The output of the output driver 306 is shown as DQ.

Figure 1:
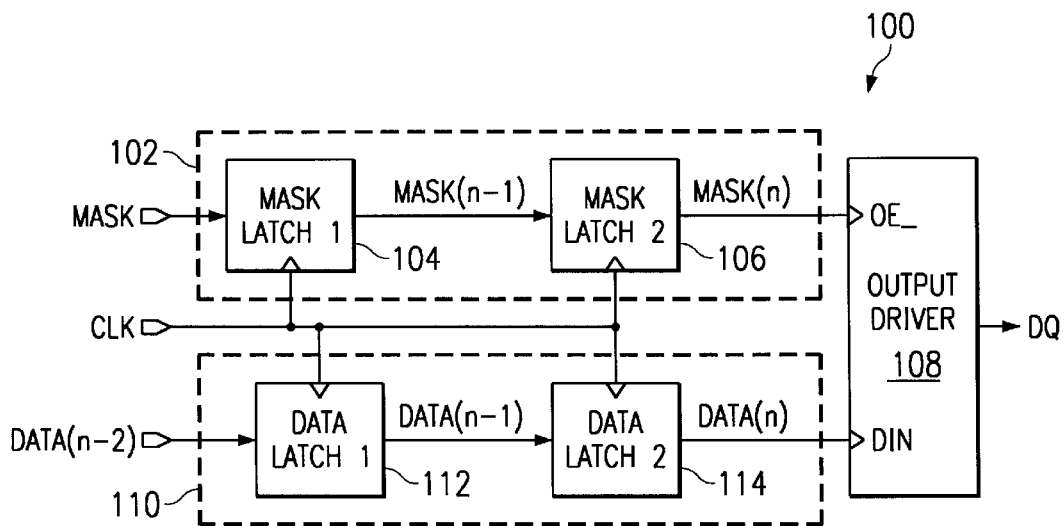
FIG. 1 is a block diagram illustrating a prior art read mask circuit.
Figure 2:
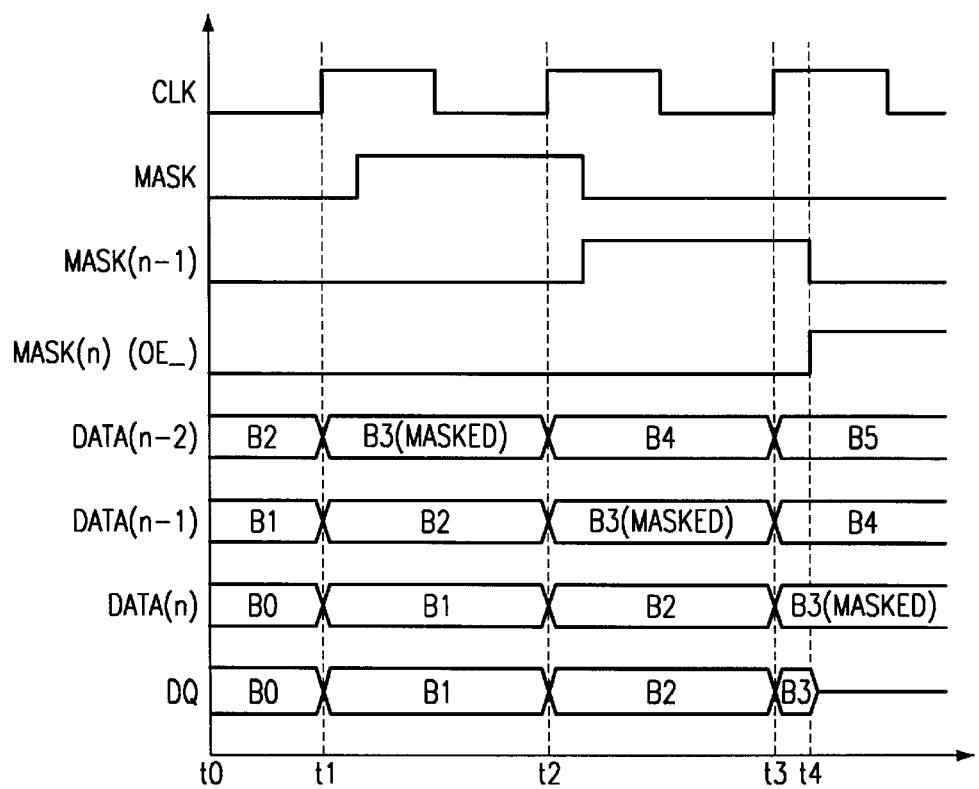
FIG. 2 is a timing diagram illustrating the operation of the read mask circuit of FIG. 1.

FIG. 4 illustrates a similar case to that set forth in FIG. 2. Six data bits, B0–B5, are pipelined through the read mask circuit 300, with the fourth data bit, B3, being masked. The value of the B3 data bit is different from the value of the B2 data bit. In addition, as in the case of the FIG. 4, the response of the read mask circuit 300 is such that the mask command path 302 introduces a delay, resulting in the data bits propagating through the data path 304 faster than the rate at which a mask command propagates through the mask command path 302.

At time t0, the CLK signal is low. A mask command has not yet propagated to the input of the first mask latch 308, and therefore, the MASK, MASK(n–1) and MASK(n) waveforms are all low.

Also at time t0, three data bits are currently in the data path 304. Bit B2 is present at the input to the first data latch 312, thus the DATA(n–2) waveform is equal to the B2 value. The data bit B1 has been latched in the first data latch 312, resulting in the output of the first data latch 312 (wave form DATA(n–1)) being equivalent to the B1 value. The data bit B0 is latched in the second data latch 314 resulting in the waveform DATA(n) being the B0 value. The MASK(n–1) signal is low at time t0, and has no effect on the second data latch 314.

The $OE_{13}$ signal is low at time t0, enabling the output driver 306. The DQ output is thus driven according to the DIN input, resulting in the DQ signal being equal to the B0 value.

At time t1, the CLK signal transitions high. A mask command is read into the chip and appears at the input of first mask latch 308. The MASK signal thus transitions high shortly after time t0 (due to the delay in the mask command path 302, mentioned previously). The MASK(n–1) and MASK(n) waveforms are low, as the mask command has yet to propagate through the mask command path 302.

The rising CLK signal results in the data bits being shifted forward along the data path 304. Thus, a new bit, B3 appears at the input to the first data latch 312. Bit B3 is the data bit that is to be masked. Bit B2 is latched in the first latch 312, thus the DATA(n–1) waveform reflects this value. Similarly, the B1 bit is shifted forward and latched in the second data 314, resulting in the DATA(n) signal being equivalent to the B1 value. Because the MASK(n–1) waveform is low at this time, the operation of the second data latch 314 is generally the same as the first data latch 312. With the B1 value as the DIN input, and the $OE_{13}$ input low, the output driver 306 drives the DQ output in accordance with the B1 value.

At time t2, the CLK signal has since transitioned low, and transitions high once again. Shortly after time t2, the MASK waveform transitions low, as no new mask command has been entered. At the same time, the MASK(n–1) signal transitions high, as the mask command propagates into the first mask latch 308. The MASK(n) waveform remains low.

Also at time t2, the data in the data path 304 shift one stage forward toward output driver 306. The DATA(n–2) waveform switches to a B4 value, as a new data bit is received at the input of the first data latch 312. The DATA (n–1) waveform is equal to the B3 value, as this value is latched in the first data latch 312. At time t2, the MASK (n–1) signal has not yet interrupted the operation of the second latch 314, thus the B2 value, previously latched in the first data latch 312 is now latched in the second data latch 314. As a result, the DATA(n) signal is equal to the B2 value beginning at time t2. Because the $OE_{13}$ input remains low, the output driver 306 will drive the DQ signal according to the B2 value.

Following time t2, the MASK(n–1) signal transitions high, and remains high past time t3. This will interrupt the operation of the second latch 314 between times t2 and t3, preventing any new data from being latched therein.

At time t3, the CLK signal has previously transitioned low, and returns high for a third time. The MASK signal is low. The MASK(n–1) signal, as previously noted is still high. Due to the propagation delay, the mask command has not yet been latched in the second mask latch 310. Thus, the MASK(n) signal (and thus the $OE_{13}$ signal) remains low.

In response to the low-to-high CLK signal transition at time t3, the first data latch 312 latches the B4 value, as a new bit, B5, appears at the input to the first data latch 312. In contrast, due to the high transition of the MASK(n–1) signal, the second latch 314 is interrupted, and does not latch the B3 data bit (the bit that was to be masked). As a result, the second latch 314 continues to provide the B2 data bit as an output. Thus, despite the fact that the output driver 306 remains enabled past the time t3, the interrupt effect of the MASK(n–1) signal guarantees that no transition in data occurs after time t3, eliminating the presence of an erroneous data bump.

At time t4, the MASK(n–1) signal transitions low, and the mask command is latched in the second mask latch 310. The MASK(n) signal goes high, and the output driver 306 is disabled, placing the DQ output in the tri-state condition.

Figure 5:
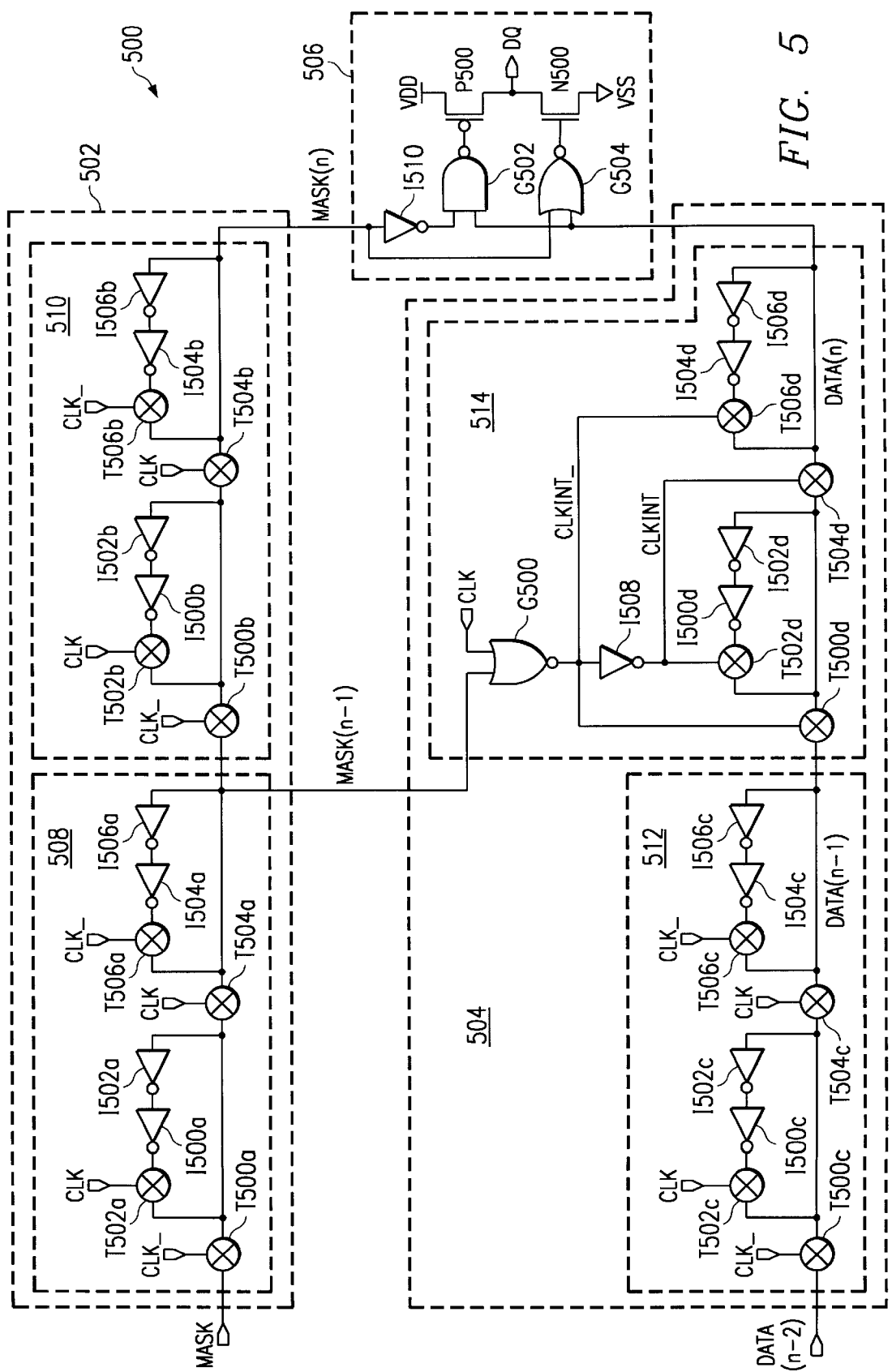
FIG. 5 is schematic diagram of a preferred embodiment.

Referring now to FIG. 5 a detailed schematic diagram is set forth, illustrating the various circuits that may be used in implementing the preferred embodiment. The read mask circuit is designated by the general reference character 500, and includes the same general functional blocks set forth in FIG. 3, including a mask command path 502, a data path 504, and an output driver 506.

A first mask latch 508 and second mask latch 510 are included within the mask command path 502. Similarly, the data path 504 includes a first data latch 512 and a second data latch 514. The first mask latch 508 receives the MASK signal as an input, and provides the MASK(n–1) signal as an output. The second mask latch 510 receives the MASK(n–1) signal as an input, and provides the MASK(n) signal as an output. The first data latch 512 receives a DATA(n–2) value as an input, and provides a DATA(n–1) value as an output. The second data latch 514 receives the DATA(n–1) value, and provides the DATA(n) value.

In the particular embodiment of FIG. 5, the various latches (508, 510, 512 and 514) have similar configurations. Therefore, items within these latches (508, 510, 512 and 514) will be referred to by the same reference character, with the items of the first mask latch 508 ending with the letter "a," the items of the second mask latch 510 ending with the letter "b," the items of the first data latch 512 ending with the letter "c," and the items of the second data latch 514 ending with the letter "d."

Each latch (508, 510, 512 and 514) includes an input stage having an input transfer gate T500, a pair of input feedback inverters I500 and I502, and an input feedback transfer gate T502. In addition, each latch (508, 510, 512 and 514) includes an output stage having an output transfer gate T504, a pair of output feedback inverters I504 and I506, and an output feedback transfer gate T506.

In the case of the two mask latches (508 and 510) and the first data latch 512, the input transfer gate T500 is shown as receiving the inverse of the CLK (or the CLK_) signal. This indicates that the transfer gate is enabled by a low CLK signal. In contrast, the input feedback transfer gate T502 is shown receiving the CLK signal, as it is enabled by a high CLK signal. The transfer gates in the output stage of the three latches (508, 510 and 512) have a timing configurations opposite to that of their respective input stage. The output transfer gate T504 receives the CLK signal, while the output feedback transfer gate T506 receives the CLK_ signal.

In the case of the second data latch 514, the transfer gates (T500d, T502d, T504d and T506d) are enabled by a clock signal that can be interrupted by the MASK(n−1) signal. This signal is shown as CLKINT, and its inverse as CLKINT_. The input transfer gate T500d and output feedback transfer gate T506d are enabled by a low CLKINT signal, and are shown receiving the CLKINT_ signal. The input feedback transfer gate T502d and output transfer gate T504d are enabled by a high CLKINT signal, and so receive the CLKINT signal.

The transfer gates (T500, T502, T504, T506) may be complementary metal-oxide-semiconductor (CMOS) transfer gates. In the case of transfer gate T500, the p-channel device of the transfer gate would receive the CLK signal, while the n-channel device would receive the CLK_ signal. It follows that in the case of the transfer gate T502, the p-channel device would receive the CLK_ signal and the n-channel device would receive the CLK signal.

Referring once again to the second data latch 514, the CLKINT_ signal is generated by logically NORing the MASK(n−1) signal with the CLK signal by operation of NOR gate G500. The CLKINT signal is generated by inverting the CLKINT_ signal with inverter 1508.

The output driver 506 includes a p-channel MOS pull-up transistor P500, and an n-channel MOS pull-down transistor N500, having source-drain paths arranged in series between a high power supply voltage VDD and a low power supply voltage VSS. The gate of transistor P500 is driven by a two-input NAND gate G502, having a first input that receives the DATA(n) value, and second input that receives the inverted MASK(n) by operation of inverter 1510. The gate of transistor N500 is driven by the a two-input NOR gate G504 that receives the MASK(n) and DATA(n) values as inputs.

Figure 6:
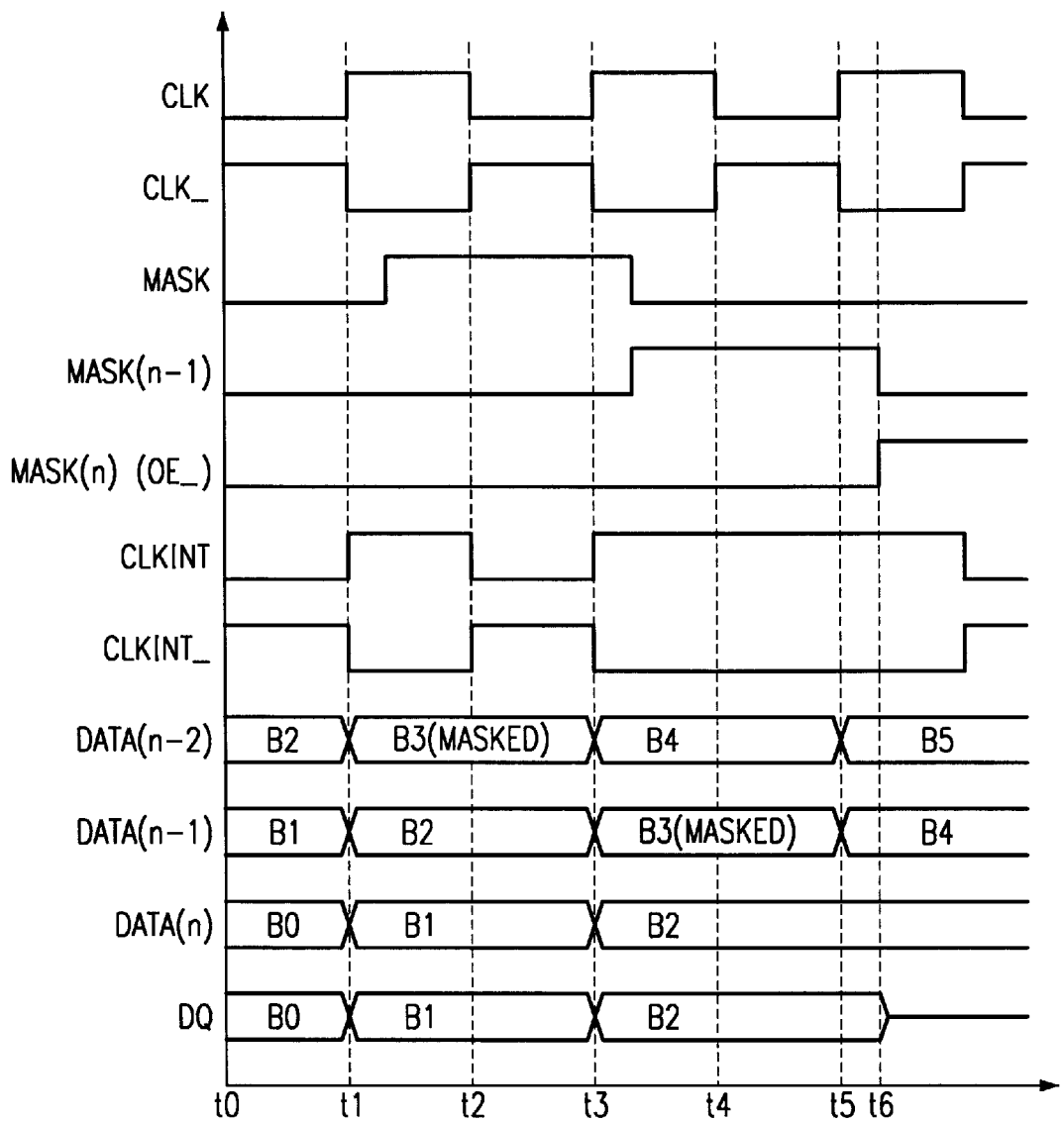
FIG. 6 is a timing diagram illustrating the operation of the embodiment set forth in FIG. 5.

The operation of the read mask circuit 500 set forth in FIG. 5 is best understood with reference to FIG. 6. FIG. 6 is a timing diagram illustrating the operation of the circuit of FIG. 5, and illustrates some of the same waveforms set forth in FIG. 4, including the CLK, MASK, MASK(n−1), MASK(n), DATA(n−2), DATA(n−1), DATA(n) and DQ waveforms. In addition, FIG. 6 further includes the inverse of the CLK signal, shown as CLK_, the interruptible clock signal CLKINT, and the inverse of the interruptible clock signal CLKINT_.

Various points of time are indicated in FIG. 6, beginning with the time t0, and ending with the time t6. As in the case of FIG. 4, the sequence of data bits, shown as B0–B5 are shifted through the mask circuit 500, with the bit B3 being masked. It is assumed that the value of the B3 bit is different than that of bit B2.

At time t0, the CLK signal is low, and the CLK_ signal is high. A mask command has not arrived at the mask command path 502, thus the MASK, MASK(n−1) and MASK.(n) waveforms are low. Because the MASK(n−1) waveform is low, the CLKINT signal tracks the CLK signal, and the CLKINT_ tracks the CLK_ signal.

As in the case of FIG. 4, data is in the data path 504 at time t0. As shown by the waveforms DATA(n−2), DATA(n−1) and DATA(n), the B0 data bit is stored in the output stage of the second data latch 514, the data bit B1 is stored at the output stage of the first data latch 512 (and the input stage of the second data latch 514 as CLKINT_ is high and as a result T500d is open), and the data bit B2 is present at the input stage of the first data latch 512.

With the MASK(n) signal low, the gate G502 receives a high input, by way of inverter 1510, and gate G504 receives a low input. In the event the DATA(n) signal is high, the output of gate G504 will be low, and transistor N500 will be turned off. The output of gate G502 will be low, and transistor P500 will be turned on, pulling the DQ output to the high (VDD) power supply voltage. In the event the DATA(n) signal is low, the output of gate G502 will be high, turning off transistor P500. The output of gate G504 will be high, and transistor N500 will be turned on, pulling the DQ output to the low (VSS) power supply voltage. In this manner, provided the MASK(n) signal is low, the output driver 506 will drive the DQ output to follow the DATA(n) value.

At time t1, the CLK signal goes high and the CLK_ signal goes low. Shortly after this time, the MASK signal goes high as a mask command arrives at the input stage of the first mask latch 508. As in the case of FIG. 4, there is some delay between the propagation of the mask command through the mask command path 502. The MASK(n−1) and MASK(n) signals are low.

Because the MASK(n−1) signal remains low at time t1, the CLKINT and CLKINT_ signals continue to follow the CLK and CLK_ signals, respectively. Thus, as the CLKINT signal goes high, transfer gate T504d is turned on, and the B1 bit value is transferred from the input stage of the second data latch 514 to its output stage. In addition, transfer gate T502d turns on, latching the B1 value by way of inverters I500d and I502d. Also at time t1, transfer gates T502c and T504c are turned on, transferring the B2 bit from the input stage of the first data latch 512 to its output stage. Inverters I500c and I502c latch the B2 value. The bit B3 (the to-be-masked bit) appears at the input of the first data latch 512.

With the MASK(n) signal low, the output driver drives DQ according to the B1 bit value.

At time t2, the CLK signal transitions low and the CLK signal transitions high. Transfer gate T500a is turned on, and the mask command is coupled into the input stage of the first mask latch 508. Transfer gate T504a remains turned off, and the MASK(n−1) and MASK(n) signals remain low.

Also at time t2, with the MASK(n−1) signal low, the CLKINT and CLKINT_ continue to follow the CLK and CLK_ signals, respectively. Thus, transfer gate T500d is turned on, coupling the B2 data bit value into the input stage of the second data latch 514. The B1 data value is latched at the output stage of the second data latch 514 by operation of transfer gate T506d and the inverters I504d and I506d. Further, transfer gate T506c is turned on, and the B2 value is latched at the output stage of the first data latch 512 by operation of inverters I504c and I506c. In addition, transfer gate T500c is turned on, and the B3 value is coupled to the input stage of the first data latch 512.

At time t3, the CLK signal goes high and the CLK_ signal goes low once again. Transfer gates T502a and T504a turn on, latching the mask command in the input stage of the first mask stage 508, and coupling the mask command to its output stage. Due to the delay between the mask command path 502 and the data path 504, shortly after time t3, the MASK(n−1) waveform transitions high. The MASK and MASK(n−1) waveforms remain low at time t3.

Also at time t3, the CLKINT and CLKINT_ signals transition high and low, respectively. Transfer gates T502d and T504d are turned on, and the B2 value is latched in the input stage of the second data latch 514, and coupled to its output latch. Further, transfer gates T504c and T502c turn on, latching the B3 data value from the input stage of the first data latch 512, and coupling this value to its respective output stage. Also at this time, a B4 value appears at the input of the first data latch 512.

With the B2 value latched at the output stage of the second data latch 514, and the MASK(n) signal remaining low, the DQ output will be driven to the B2 level.

At time t4, the CLK and CLK_ signals transition once again. The high CLK_ level results in transfer gates T506a and T500b turning on, latching the mask command in the output stage of the first mask latch 508, and coupling the mask command to the input of the second mask latch 510. Thus the MASK(n−1) signal remains high.

With the MASK(n−1) signal high, and the CLK signal low, the output of gate G500 is low, keeping transfer gate T500d turned off. Thus, unlike the previous high-to-low CLK transitions, a data bit value is not coupled into the input stage of the second data latch 514. Instead, the previous input value (B2), remains stored in the input and output stages of the second data latch 514. In this manner, the masked bit, B3, is prevented from being input into the second data latch 514 by the high output level of the first mask latch 508 (the MASK(n−1) signal).

In contrast to the interrupted second data latch 514, the first data latch 512 continues to shift data (this is important so as not to jeopardize the data-sequence of the ongoing burst). As the CLK signal transitions low at time t4, the B3 (to masked) data value is latched at the output stage of the first data latch 512 (but prevented from being input into the second data latch 514 by transfer gate T500d). At the same time, the B4 data value is coupled to the input stage of the first data latch 512 by transfer gate T500c turning on.

With the B2 value continuing to be output by the second data latch 514, and the MASK(n) signal remaining low, the DQ output of the output driver 506 is the B2 value.

At time t5, the CLK signal transitions high and the CLK_ signal transitions low. Transfer gate T502b turns on, latching the mask command at the input stage of the second mask latch 510, by operation of inverters I500b and I502b. Transfer gate T504b is also turned on, coupling the mask command to the output stage of the second mask latch 510. In this manner, the MASK(n) signal is driven high. There is some delay, however, therefore the MASK(n) signal goes high shortly after time t5.

Initially at time t5, the MASK(n−1) signal remains high. Therefore, the CLKINT and CLKINT_ signals do not change state, maintaining the second data latch 514 in the interrupted state. Thus, the B2 value continues to be stored in the input and output stages of the second data latch 514. At the same time, data continues to be shifted in the first data latch 512. As the CLK signal goes high, transfer gates T502c and T504C are turned on. The B4 data bit is latched in the input stage of the first data latch 512 by operation of inverters I500c and I502c. Furthermore, the B4 data value is coupled to the output stage of the first data latch 512, essentially destroying the previously stored B3 data in the output stage of the first data latch 512.

At time t5, with the DATA(n) value maintained at the B2 value, and the MASK(n) signal still low, the DQ output of the output driver 506 is maintained at the B2 value. Thus, unlike the prior art case, where a data bump is introduced by the propagation of a to-be-masked data bit (B3), the previous data value is maintained, and the to-be-masked data bit is not allowed to propagate to the output driver 506.

At time t6, the MASK(n−1) waveform returns low, and the MASK(n) signal transitions high. With the MASK(n) signal high, one input of gate G502 is driven low, by inverter I510. This forces the output of gate G502 high, turning off transistor P500, regardless of the value of its other input. Similarly, the high MASK(n) signal results in one input of gate G504 being high, forcing the output of gate G504 to be low, regardless of the value of its other input. This turns off transistor N500. With transistors P500 and N500 turned off, the DQ output is placed in the tri-state condition.

While the particular embodiment illustrated set forth case in which the mask command path and data path each include two stages, it is understood that the mask command stage could include more than two such stages, and the data read path include one or more of such stages. Further, while a particular type of latch circuit and output driver are illustrated in FIG. 5, this should not be construed as limiting the scope of the invention. It is to be additionally noted that while the circuit scheme has been described as working as the masking operation during read has a latency of 2, that the same idea can be utilized where the read mask has a latency greater than 2.

Accordingly, although the present invention has been described in detail, it should be understood that various changes, substitutions, and alterations could be made without departing from the spirit and scope of the invention as defined by the appended claims.

What is claimed is:

1. A read mask circuit, comprising:
   an output driver that receives data at a data input node, the output driver having an enable mode and a disable mode, determinable by a logic value at an output enable node;
   a mask command path that receives a mask command, and includes at least an initial mask latch and a subsequent mask latch arranged in series, the initial and subsequent mask latches being commonly activated by a clock signal to propagate the mask command along the mask command path, the subsequent mask latch being coupled to the output enable node; and
   a data path having at least a subsequent data latch activated by said clock signal and having an output coupled to the data input node, the subsequent data latch having an input that is disabled in response to signals at an interrupt node, the interrupt node being coupled to the first mask latch.

2. The circuit of claim 1, wherein:

the output driver includes a pull-up device coupled between an output node and a first power supply, and a pull-down device coupled between the output node and a second power supply, the pull-up and pull-down devices being turned off in the disable mode.

3. The circuit of claim 2, wherein:

the pull-up device is a p-channel insulated gate field effect transistor (IGFET) and a pull-down device is an n-channel IGFET.

4. The circuit of claim 1, wherein:

the initial mask latch includes an initial mask input and an initial mask output, the subsequent mask latch includes a subsequent mask input and a subsequent mask output, the initial mask output being coupled to the subsequent mask input, and the subsequent mask output being coupled the output enable node.

5. The circuit of claim 4, wherein:

the initial mask latch latches values at the initial mask input in response to the clock signal, and the subsequent mask latch latches values at the initial mask output in response to the clock signal.

6. The circuit of claim 1, wherein:

the subsequent data latch includes a subsequent latch input, a subsequent latch output, and an interrupt input, the subsequent latch receiving a data value input, the subsequent latch output being coupled to the data input node, and the interrupt node being coupled to the input of the subsequent mask latch.

7. The circuit of claim 6, wherein:

the subsequent mask latch includes a subsequent mask input and a subsequent mask output, the subsequent mask input being coupled to the interrupt node.

8. In a random access memory, a read mask scheme, comprising:

a plurality of data shift stages for receiving read data, the data shift stages including a subsequent data shift stage, the operation of the subsequent shift stage being interrupted by an interrupt signal at an interrupt node; and a plurality of command shift stages for receiving a mask command, the command shift stages including a subsequent command shift stage and an initial command shift stage, each shift stage including an input and an output, the output of the initial command shift stage being coupled to the interrupt node, and providing the interrupt signal thereto.

9. The read mask scheme of claim 8, wherein:

the plurality of data shift stages shifts read data bits in response to a clock signal; and the plurality of command shift stages shift mask command values in response to the clock signal.

10. The read mask scheme of claim 9, wherein:

the clock is periodic.

11. The read mask scheme of claim 9, wherein:

the random access memory is a synchronous random access memory that receives a system clock; and the clock signal is synchronous with the system clock.

12. The read mask scheme of claim 11, wherein:

the random access memory is a synchronous dynamic random access memory.

13. The read mask scheme of claim 8, wherein:

the plurality of command shift stages shifts mask command values that are delayed with respect to the read data.

14. The read mask scheme of claim 8, further including:

an output driver having an enable mode in which an output node is driven to logic values based upon data values at a data input, and a disable mode in which the output node is maintained at a high impedance state, the mode of the output driver being based upon command values at an output enable input;

the plurality of data shift stages shift read data in pipelined fashion to the data input of the output driver; and the plurality of command shift stages shift command data values to the output enable input.

15. In a random access memory having a data bit pipeline and mask command pipeline coupled to an output driver, a method of masking data bits in the data pipeline, comprising the steps of:

shifting data bits through a series of data stages to a data latch;

shifting a mask command value through a series of mask command stages in a generally synchronous fashion with respect to the data bits in the data stages, the mask command stages including a subsequent command latch, and an initial command latch; and preventing a data bit from being latched in the data latch by interrupting the data latch according values latched in the initial command latch.

16. The method of claim 15, wherein:

the step of shifting data bits through a series of data stages includes enabling a series of data latches in response to a synchronous clock signal.

17. The method of claim 15, wherein:

the step of shifting a mask command value through a series of mask command stages includes enabling a series of mask command latches in response to a synchronous clock signal.

18. The method of claim 15, further including the step of:

driving an output driver according to values stored in the data latch.

19. The method of claim 18, further including the step of:

disabling an output driver in response to mask command being stored in the subsequent command latch.

20. The method of claim 19, wherein:

the step of disabling an output driver includes placing an output of the output driver in a high impedance state.

* * * * *